(12) United States Patent
Chou et al.

(10) Patent No.: US 8,105,752 B2
(45) Date of Patent: Jan. 31, 2012

(54) PHOTOSENSITIVE POLYIMIDES

(75) Inventors: Meng-Yen Chou, Kaohsiung (TW); Chuan Zong Lee, Kaohsiung (TW)

(73) Assignee: Eternal Chemical Co., Ltd., Kaohsiung (TW)

( * ) Notice: Subject to any disclaimer, the term of this patent is extended or adjusted under 35 U.S.C. 154(b) by 92 days.

(21) Appl. No.: 12/534,173

(22) Filed: Aug. 3, 2009

(65) Prior Publication Data
US 2010/0086871 A1  Apr. 8, 2010

(30) Foreign Application Priority Data

Oct. 8, 2008  (TW) ................................ 97138792 A

(51) Int. Cl.
*G03F 7/004* (2006.01)
*C08G 69/26* (2006.01)

(52) U.S. Cl. ............... 430/287.1; 430/270.1; 430/286.1; 528/350; 528/353

(58) Field of Classification Search ............... 430/270.1, 430/286.1, 287.1, 906; 528/350, 353
See application file for complete search history.

(56) References Cited

U.S. PATENT DOCUMENTS

| 7,282,323 B2 * | 10/2007 | Kanatani et al. ........... 430/281.1 |
| 7,985,482 B2 * | 7/2011 | Lai et al. .................... 428/473.5 |
| 2009/0205855 A1 * | 8/2009 | Lai et al. ....................... 174/258 |

* cited by examiner

*Primary Examiner* — John Chu
(74) *Attorney, Agent, or Firm* — Ladas & Parry LLP

(57) ABSTRACT

The invention pertains to an epoxy-modified photosensitive polyimide, which possesses excellent heat resistance, chemistry resistance, and flexibility, and can be used in a liquid photo resist or dry film resist, or used in a solder resist, coverlay film, or printed circuit board.

11 Claims, No Drawings

PHOTOSENSITIVE POLYIMIDES

BACKGROUND OF THE INVENTION

1. Field of the Invention

The present invention relates to a photosensitive polyimide for use as a liquid photo resist or dry film resist, or for use in a solder resist, coverlay film, or printed wiring board.

2. Description of the Prior Art

These days, electronic products are made light and small. Therefore, various electronic parts have been miniaturized. Since flexible printed wiring boards are excellent in terms of flexibility and weight and resistant to high temperatures, the demand for them has increased. For instance, currently popular electronic products such as mobile phone, LCD, PLED, and OLED all utilize flexible printed wiring boards. Compared with conventional silicon or glass substrates, flexible printed wiring boards, also called soft boards, have better flexibility. Normally, flexible printed wiring boards consist of an insulated substrate, a binder, and a copper conductor. Moreover, to prevent the copper circuits on flexible printed wiring boards from being oxidized or influenced by the environmental humidity, a coverlay film, which is normally composed of an insulated substrate and a binder, is usually applied onto the boards.

Coverlay film can be classified into three types according to the material: photosensitive coverlay, non-photosensitive coverlay, and thermal plastic coverlay. Photosensitive coverlay can be polyimide based (PI based coverlays) or non-polyimide based (non-PI based coverlays), while utilization of the non-polyimide based coverlay is limited because it has lower heat resistance and a higher coefficient of thermal expansion. As to non-photosensitive coverlay, its manufacture is more complicated than that of photosensitive coverlay, and it is not as useful as photosensitive coverlay. As to thermal plastic coverlay, it needs post processing for forming holes and is not as convenient to use as photosensitive coverlay.

Conventional photosensitive polyimides are formed from the corresponding polyamic acid or polyamic ester precursors. However, since the formation requires high-temperature hard baking (i.e., baking at a temperature more than 300° C.), the copper circuits are liable to be oxidized and the electrical properties and reliability of the products are adversely affected. JP Patent Publication No. 2003-345007 discloses a photosensitive polyimide that can be produced by a process without high-temperature hard baking, the process comprising forming an ionic bonding between an acrylate monomer containing a tertiary amino and a soluble polyimide containing —COOH radicals in the main chain so as to form a negative type photosensitive polyimide. However, the polyimides of this JP case are not suitable for the applications in which thicker polyimide films, coverlay films, or soft boards are necessary.

SUMMARY OF THE INVENTION

The present invention provides a photosensitive polyimide that is curable at a low temperature, can be formed into a thick film, and possesses better reactivity, stability, and heat resistance.

The present invention further provides a photosensitive composition comprising the above-mentioned photosensitive polyimide for use as a protective material or a photo resist. The photosensitive composition of the invention possesses excellent electrical properties, heat resistance, flexibility, and chemistry resistance, and can be used as a protective material for used in a solder resist, coverlay, and printed wiring board.

DETAILED DESCRIPTION OF THE INVENTION

The photosensitive polyimide according to the present invention has the structure of the following formula (I):

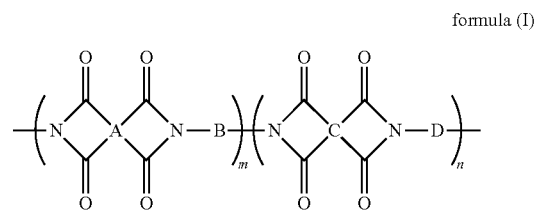

formula (I)

wherein:

A represents a tetravalent organic group with at least one modifying group $R_1$;

B and D are the same or different and each represent a divalent organic group;

C represents a tetravalent organic group without any modifying group $R_1$;

m represents an integer of more than 0; and n represents 0 or an integer more than 0, where the modifying group $R_1$ is selected from the group consisting of:

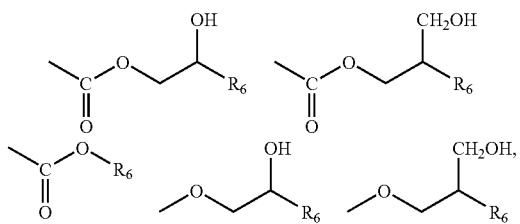

wherein $R_2$ represents a vinyl-group containing unsaturated radical, and preferably, said vinyl-group containing unsaturated radical is selected from the following:

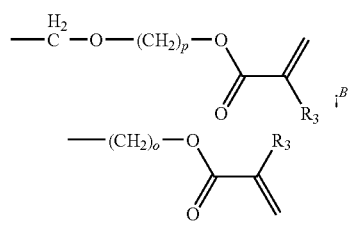

wherein R3 is H or methyl, and o and p each represent an integer from 0 to 6, preferably, from 2 to 4.

The tetravalent organic groups A and C of the photosensitive polyimide of formula (I) of the present invention are not particularly limited. For example, they can be tetravalent aromatic groups or tetravalent aliphatic groups. Preferably, A is selected from:

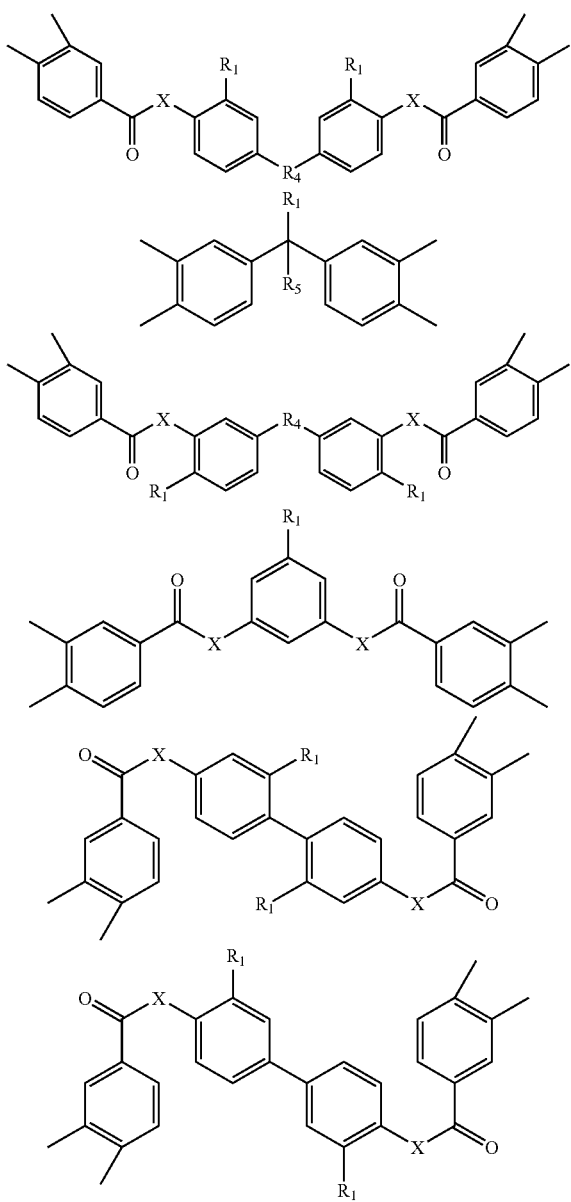
wherein $R_1$ is an organic radical selected from:
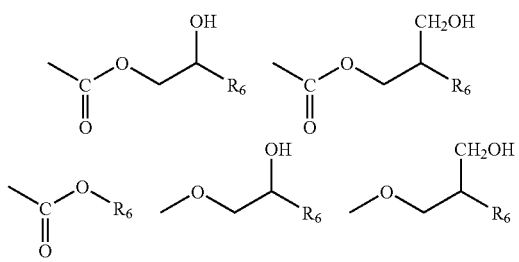
Wherein:
$R_2$ is as defined hereinbefore;
$R_4$ is —$CH_2$—, —O—, —S—, —CO—, —$SO_2$—, —$C(CH_3)_2$—, or —$C(CF_3)_2$—;
$R_5$ is —H or —$CH_3$; and
X is —O—, —NH—, or —S—.
More preferably, A is selected from:
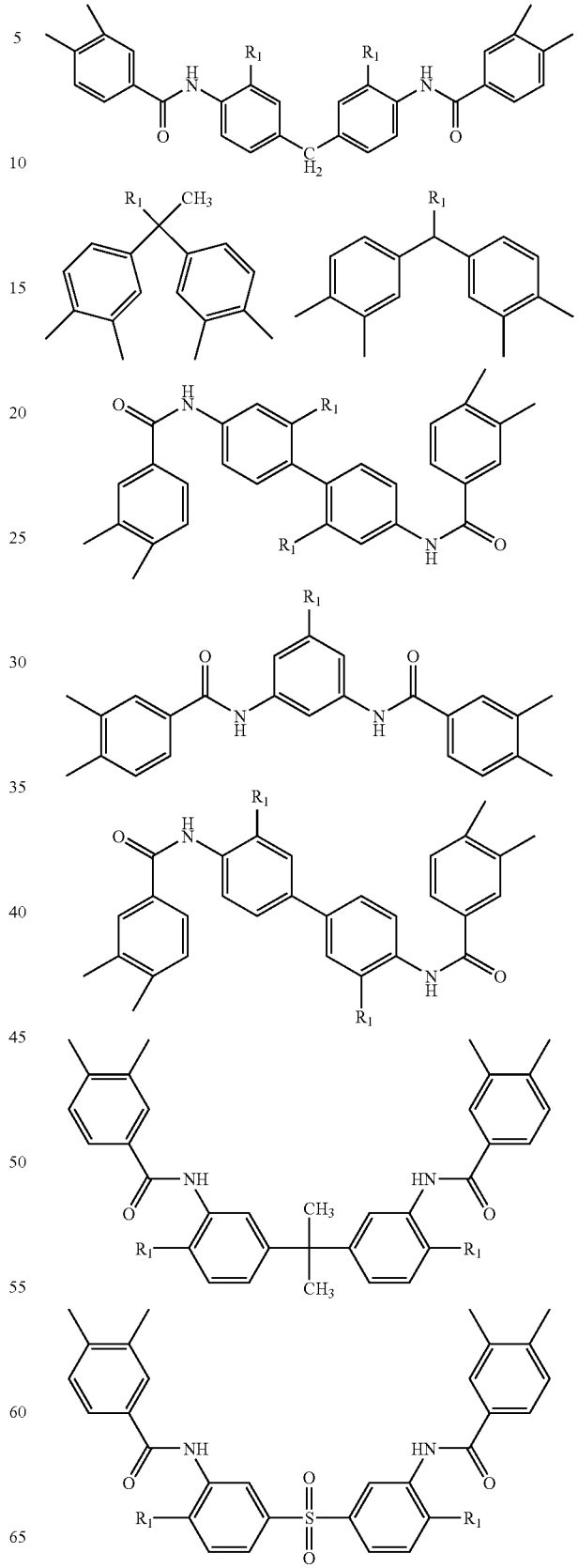

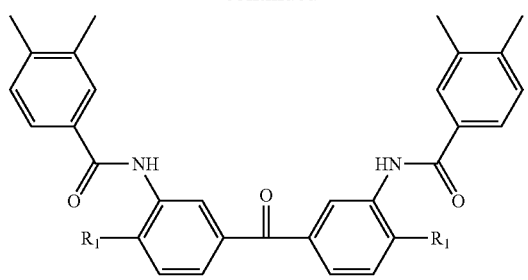
wherein R₁ is as defined hereinbefore.
In the above-mentioned formula (I), C is independently selected from the group consisting of:
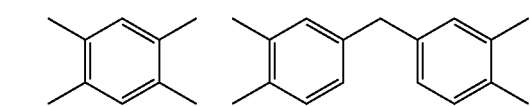
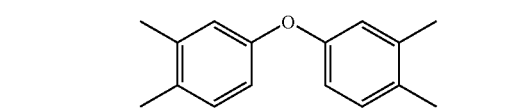
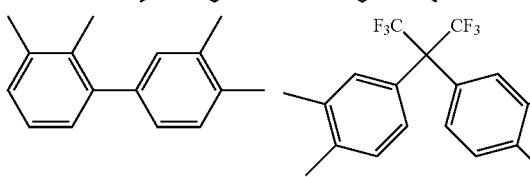
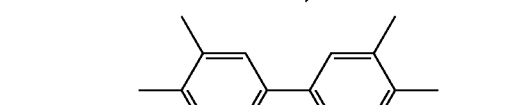
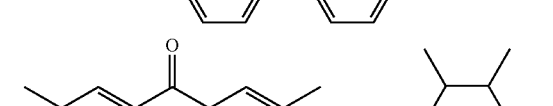
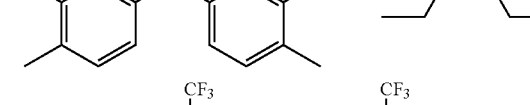
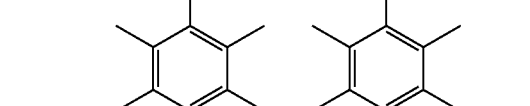
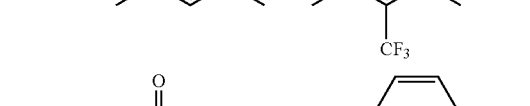
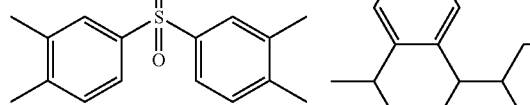
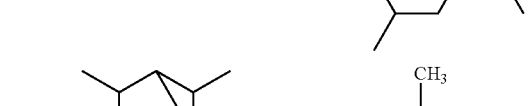
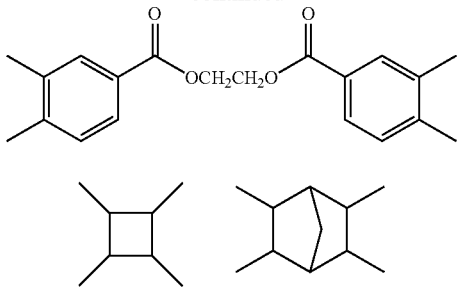
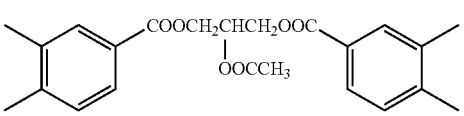
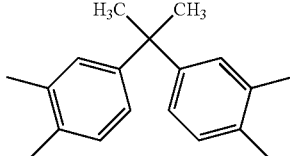
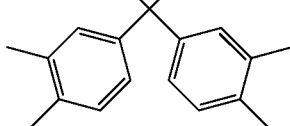
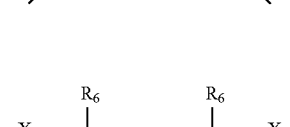
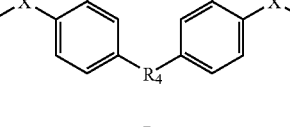
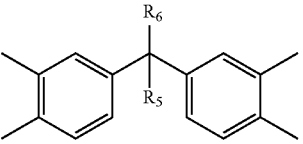
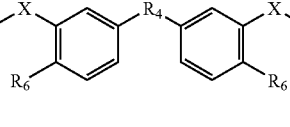
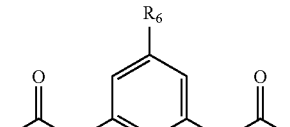
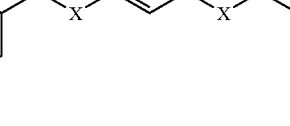
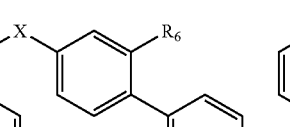

-continued
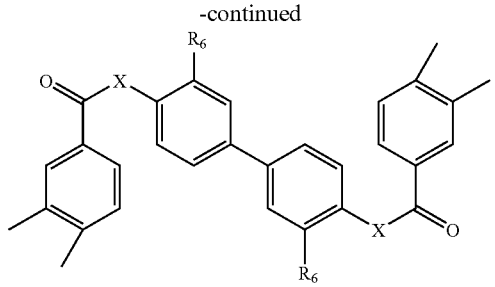
wherein:
R₄, R₅, and X are as defined hereinbefore; and
R₆ is OH, COOH, or NH₂.
Preferably, C is selected from the group consisting of:
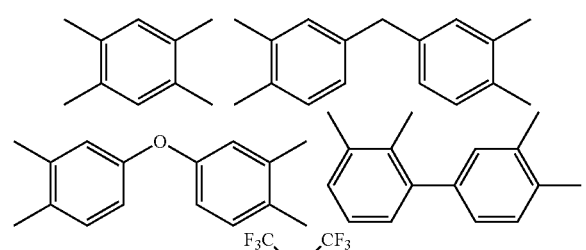
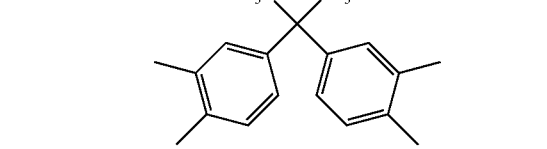
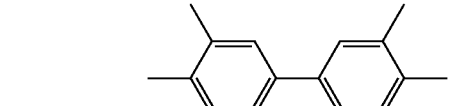
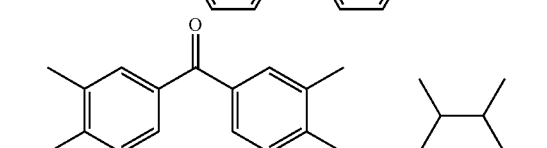
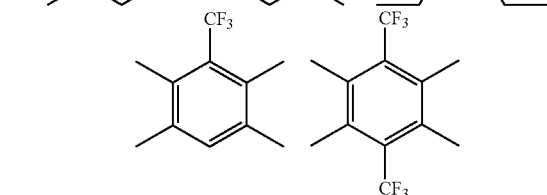
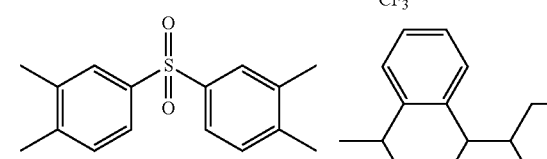
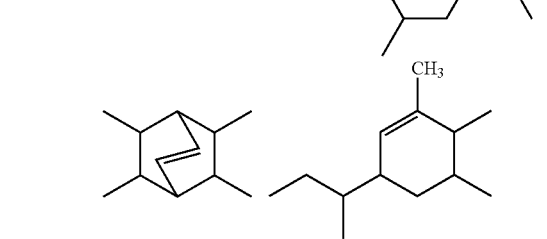
-continued
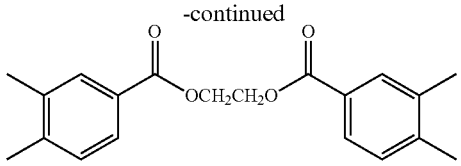
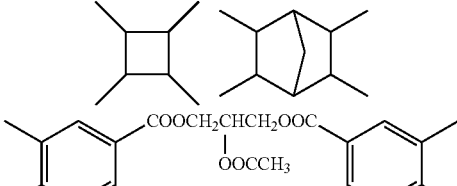
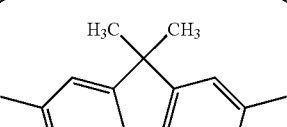
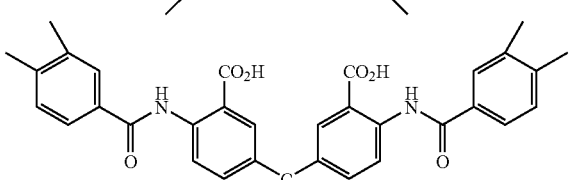
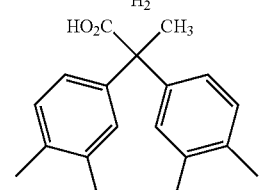
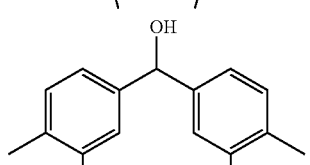
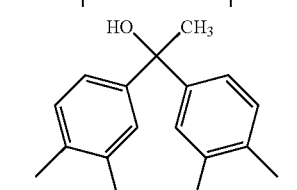
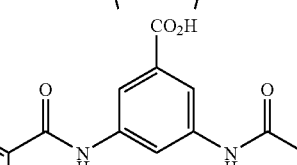
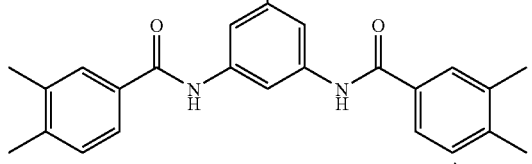
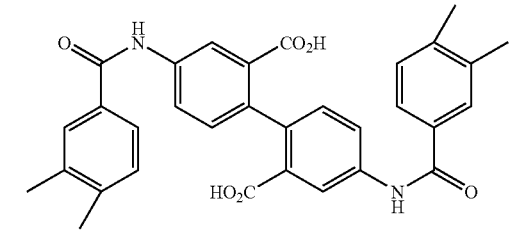

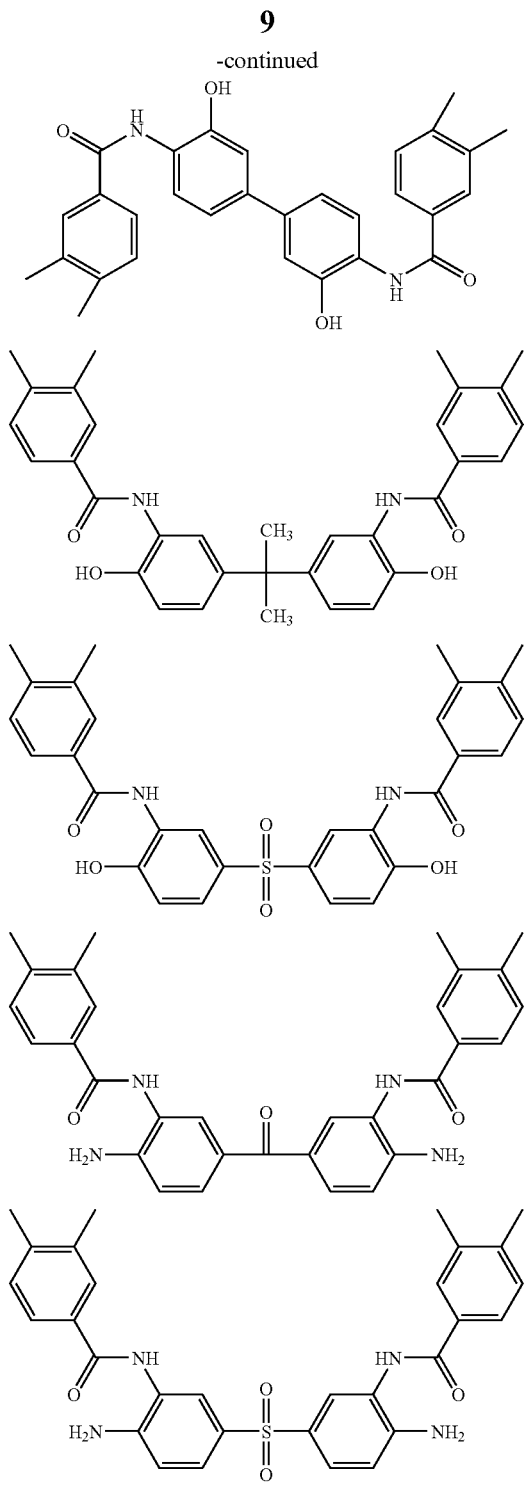

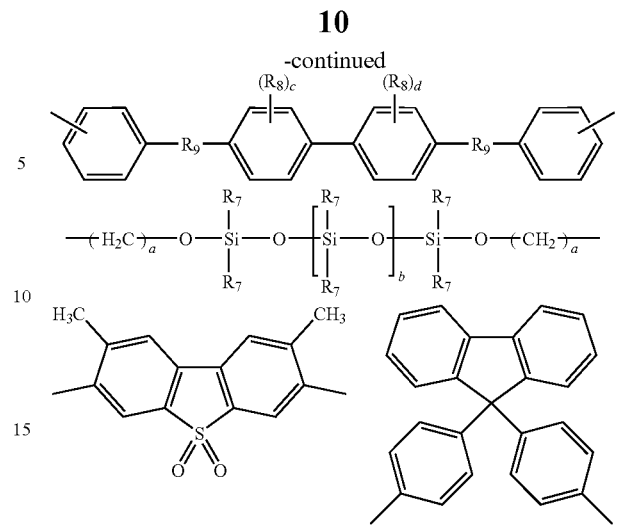

wherein:

$R_7$ is H, methyl, or ethyl;

$R_8$ is H, $C_1$-$C_4$ alkyl, $C_1$-$C_4$ perfluoroalkyl, methoxy, ethoxy, halogen, OH, COOH, $NH_2$ or SH;

a is integer of more than 0;

b is integer of more than 0;

c is an integer of 0 to 4;

d is an integer of 0 to 4; and $R_9$ is a covalent bond or a radical selected from:

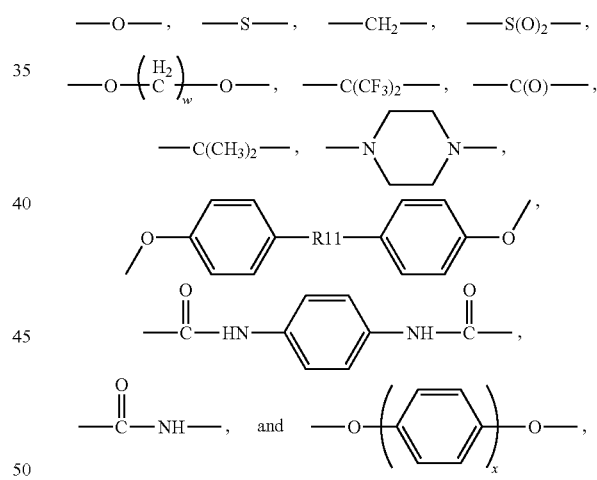

wherein w and x each represent an integer of more than 0, and $R_{11}$ is —S(O)$_2$—, —C(O)—, a covalent bond, or a substituted or unsubstituted $C_1$ to $C_{18}$ organic group.

Preferably, B and D are independently selected from the group consisting of:

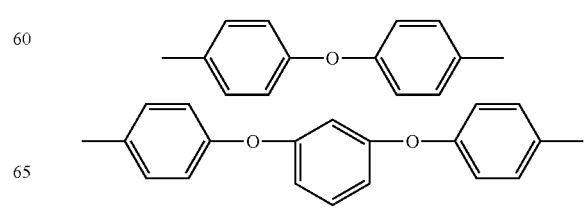

In formula (I), B and D each represent a divalent organic radical. Preferably, B and D are independently selected from the group consisting of:

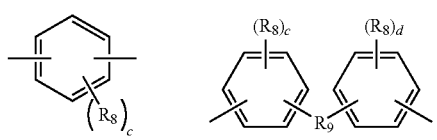

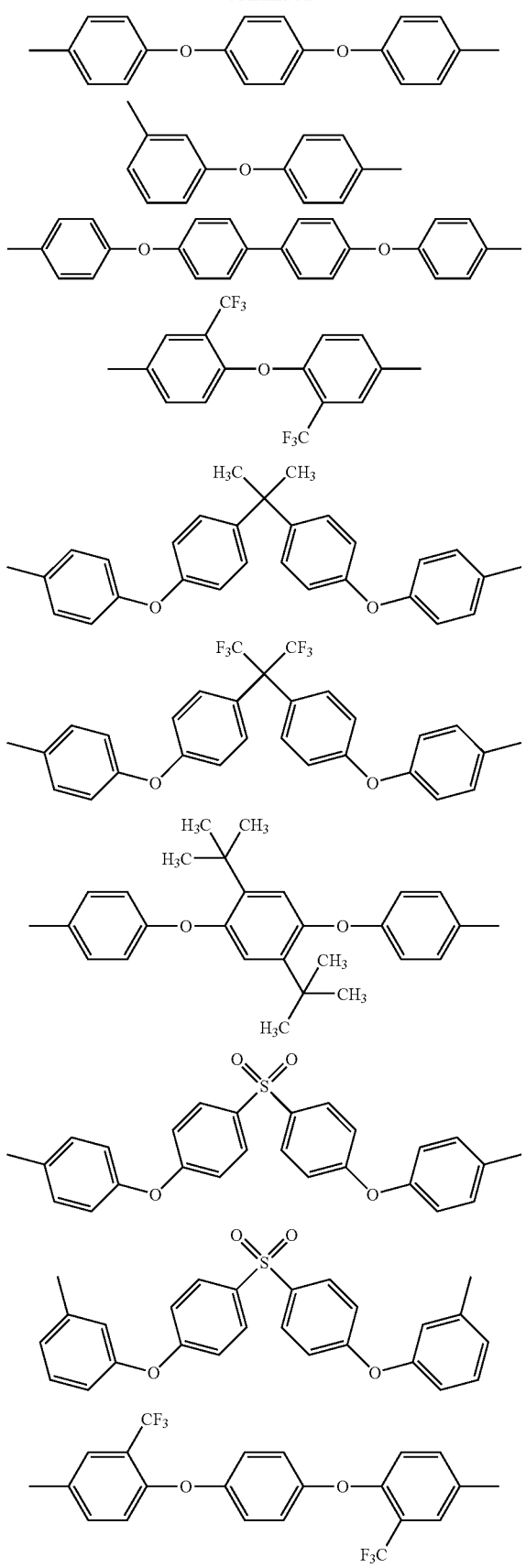
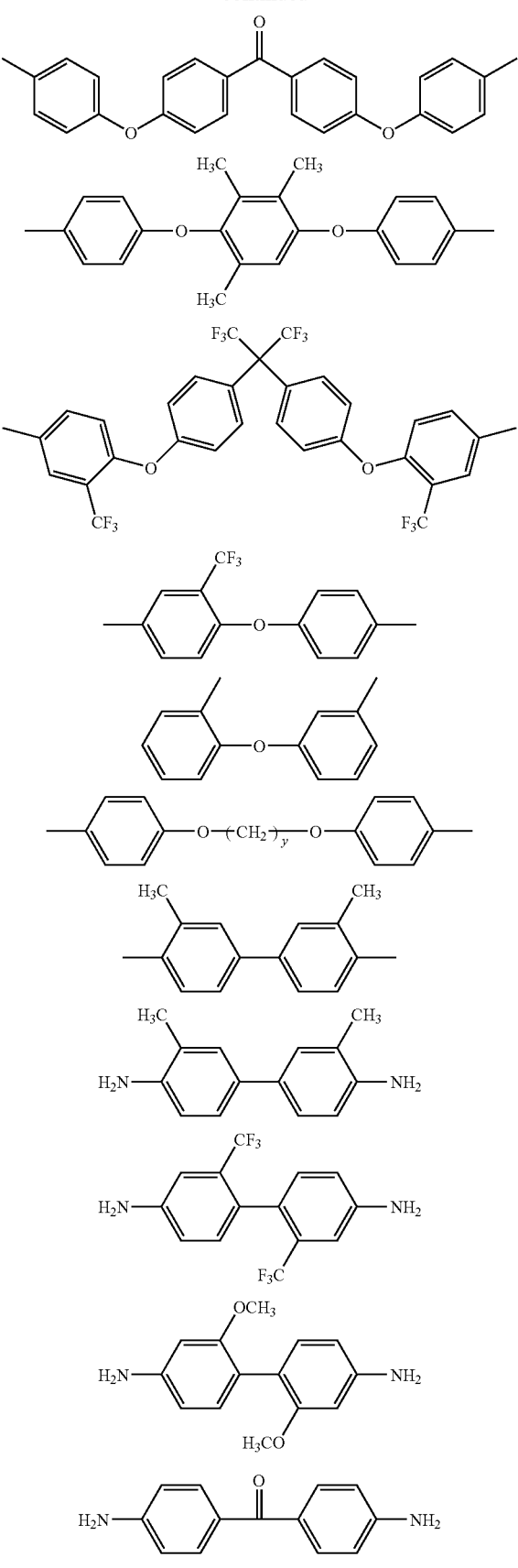

-continued

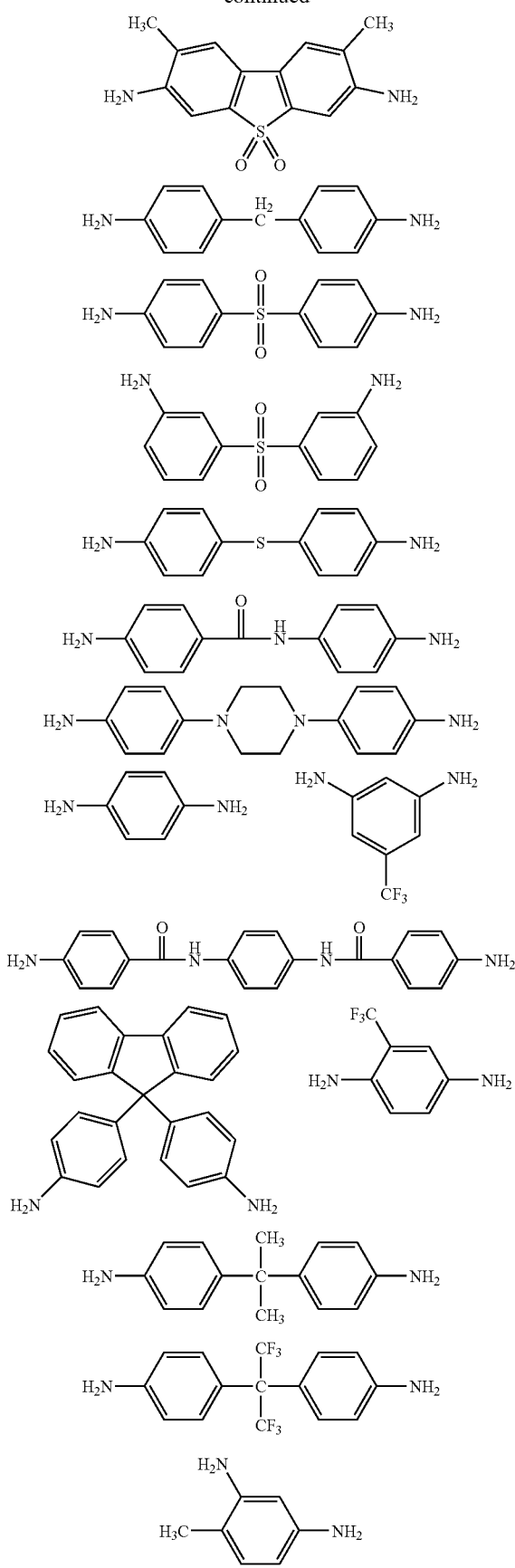

-continued

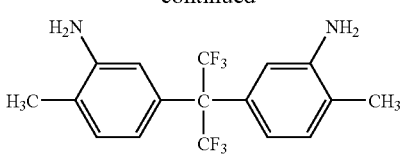

wherein y is an integer of 1 to 12, preferably an integer of 1 to 6.

In order to impart polyimides with a photosensitive group so that radiation curing mechanism can be utilized, the present invention modifies polyimides with an epoxy compound having a photosensitive group, such as a C=C double bond. The epoxy compound utilized in the present invention can react with the reactive groups, such as —OH and —COOH, in the polyimides and thus makes the polyimides modified. The epoxy used in the present invention is preferably, but not limited to:

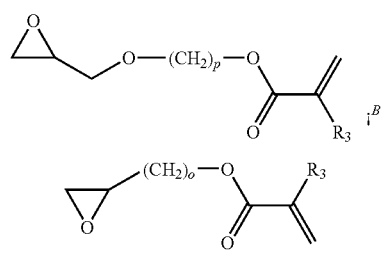

wherein $R_3$ is H or methyl, o and p each represent an integer of 0 to 6, preferably an integer of 2 to 4.

The photosensitive polyimides of the present invention can be produced by any conventional polymerization process known to persons having ordinary skill in the art, such as a process comprising the following steps:

(a) reacting a diamine monomer of formula $H_2N$—P—$NH_2$ with a dianhydride monomer of formula

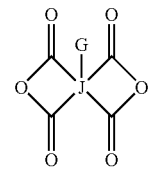

and another dianhydride monomer

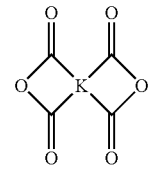

to form a compound of the following formula (1):

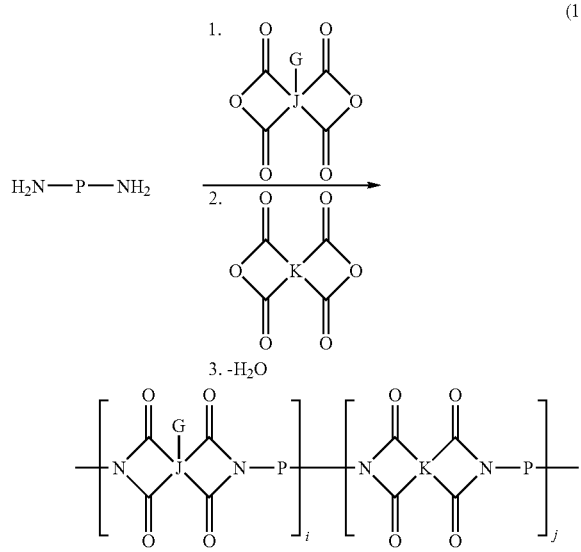

(1)

wherein G is a reactive functional group, such as a radical of OH, COOH, or NH$_2$, and in the case where G is COOH, conducting the following step:
b) adding an epoxy compound, for example, glycidyl methacrylate, to the product obtained from step (a) to form a compound of formula (2):

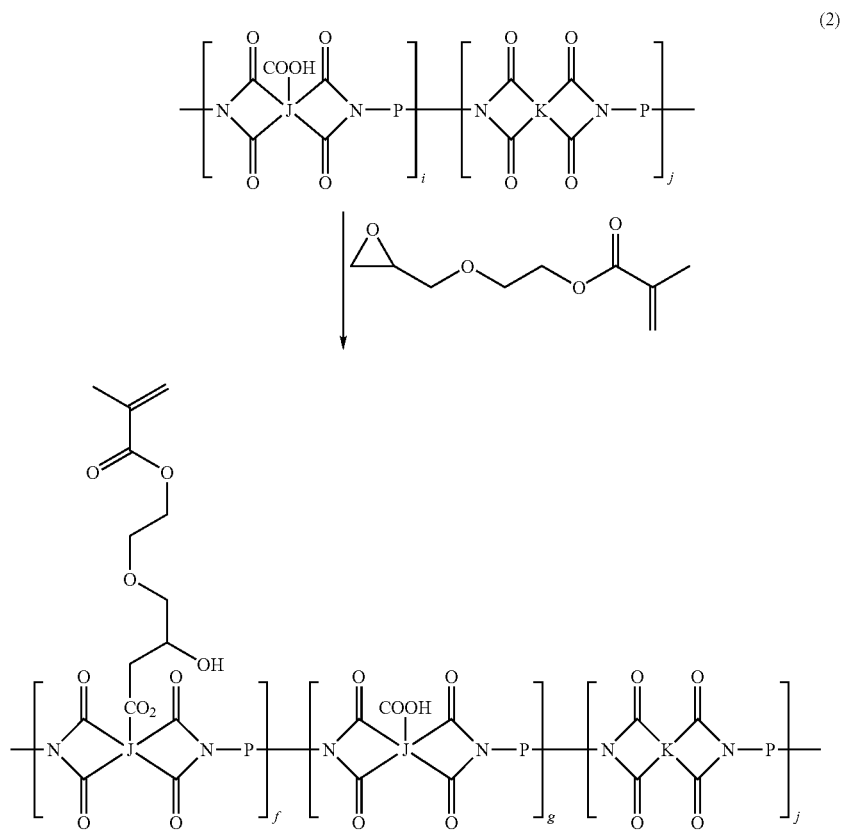

(2)

wherein f+g=i

In the above process for preparing the photosensitive polyimide, the diamine monomers suitable for the present invention include, but are not limited to, the following:

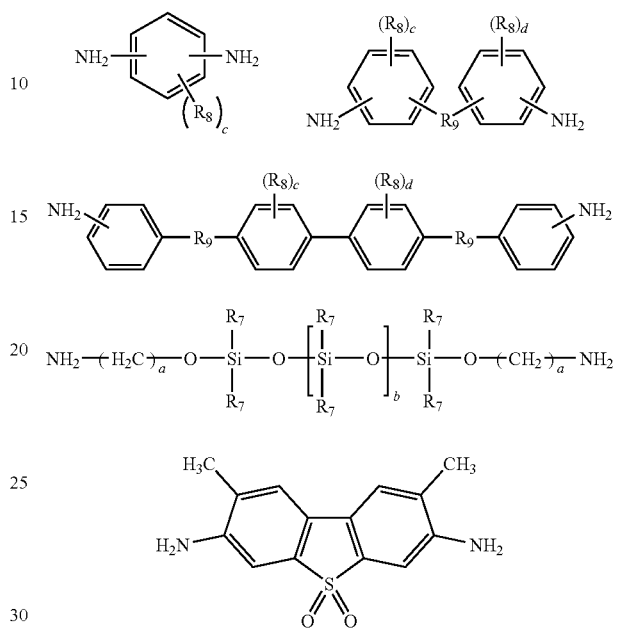

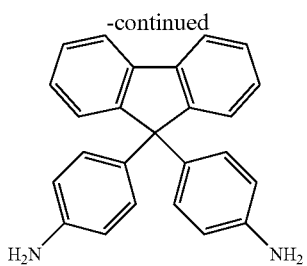

wherein:
R₇ represents H, methyl, or ethyl;
R₈ represents H, $C_1$-$C_4$ alkyl, $C_1$-$C_4$ perfluoroalkyl, methoxy, ethoxy, halogen, OH, COOH, $NH_2$ or SH;
a is integer of more than 0;
b is integer of more than 0;
c is an integer of 0 to 4;
d is an integer of 0 to 4; and
R₉ is a covalent bond or a radical selected from:

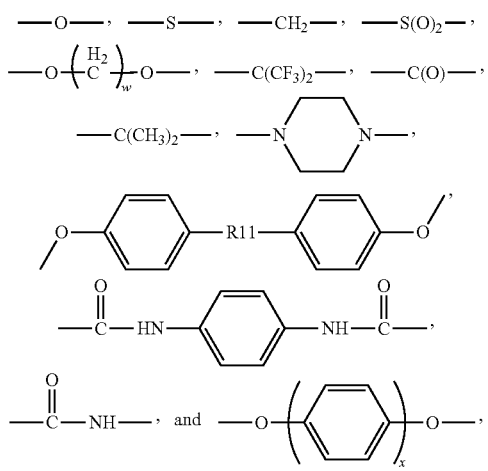

wherein w and x each represent an integer of more than 0, and $R_{11}$ is —$S(O)_2$—, —C(O)—, a covalent bond, or a substituted or unsubstituted $C_1$ to $C_{18}$ organic group.

Preferably, the above-mentioned diamine monomer is selected from the following or a mixture thereof:

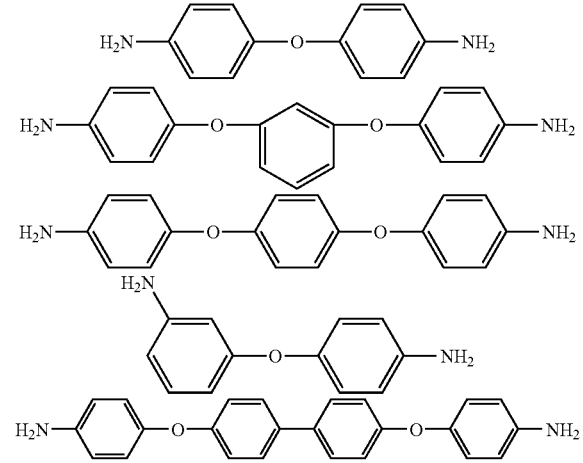

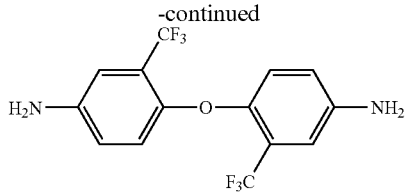

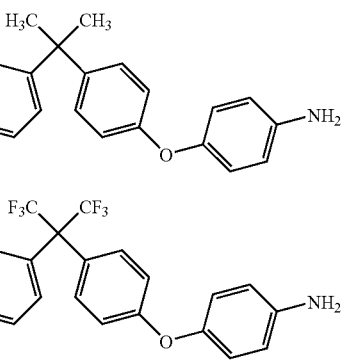

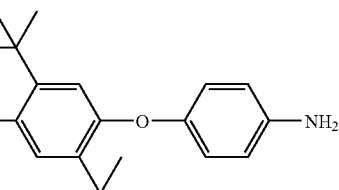

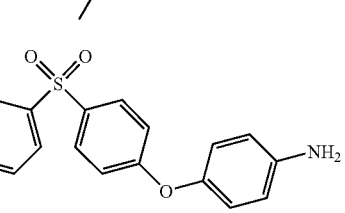

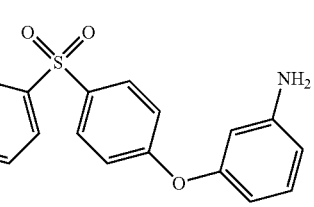

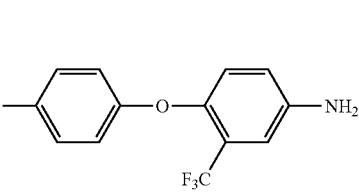

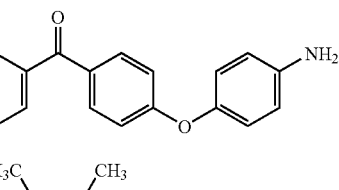

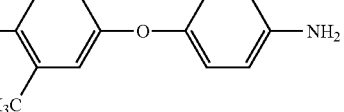

-continued
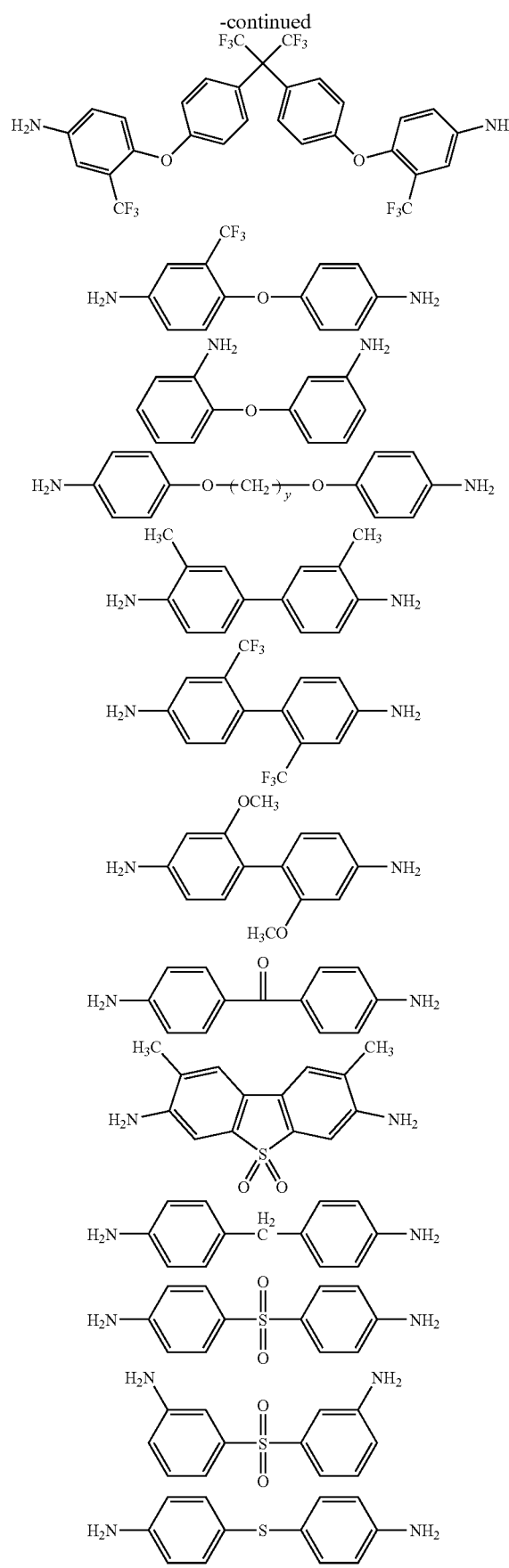
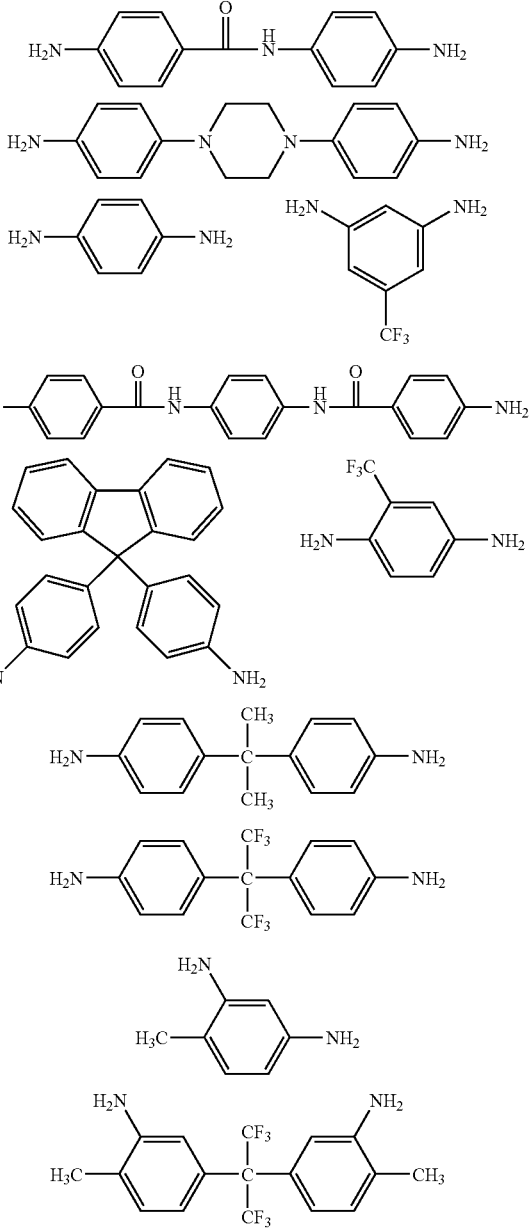
wherein y is an integer of 1 to 12, preferably an integer of 1 to 6.
In the above process for preparing the photosensitive polyimide, the dianhydride monomer containing a reactive functional group can be selected from the following or a mixture thereof:
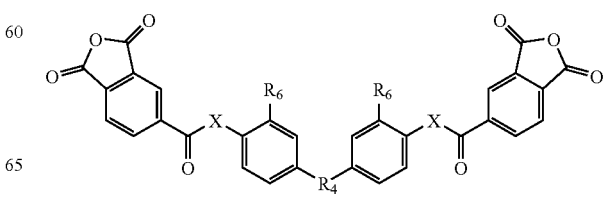

-continued

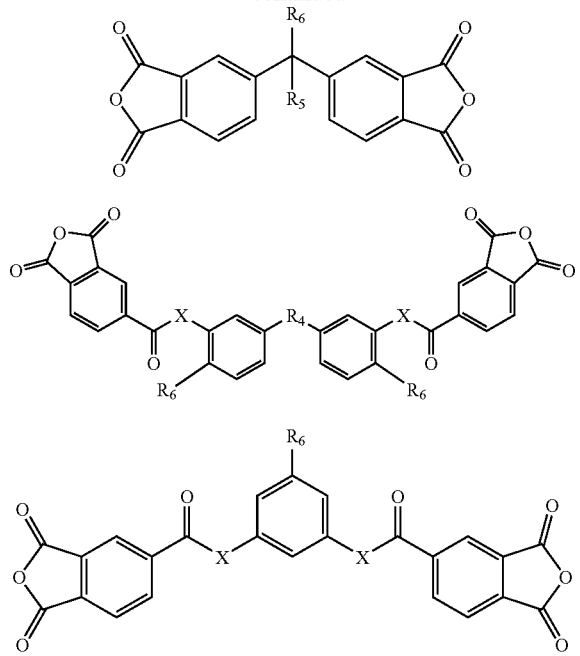

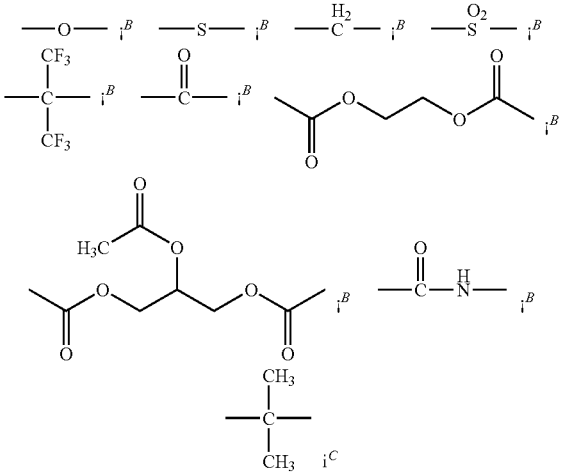

wherein:

R$_4$ represents —CH$_2$—, —O—, —S—, —CO—, —SO$_2$—, —C(CH$_3$)$_2$—, or —C(CF$_3$)$_2$—;

R$_5$ represents —H or —CH$_3$;

R$_6$ represents OH, COOH, or NH$_2$; and

X is —O—, —NH—, or —S—.

In the above process for preparing the photosensitive polyimide, the another dianhydride monomer is not particularly limited and can have or does not have a reactive functional group. Suitable dianhydride monomers without a reactive functional group are well known to persons having ordinary skill in the art, which include, for example, but are not limited to:

wherein:

E, F and H each represent a covalent bond or a substituted or unsubstituted, C$_1$ to C$_{20}$ saturated or unsaturated, cyclic or acyclic organic group;

R$_{20}$ represents a covalent bond or a radical selected from the following:

Preferably, the dianhydride monomer without a reactive functional group is preferably, but not limited to, the compound selected from the following:

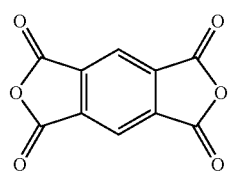

-continued

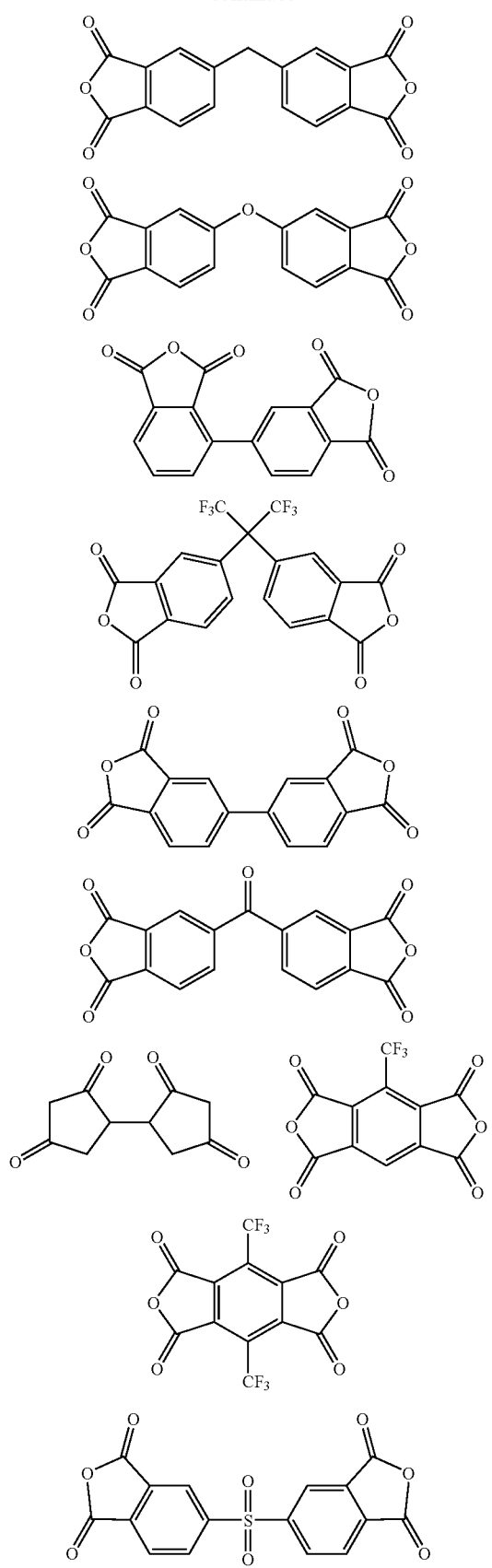

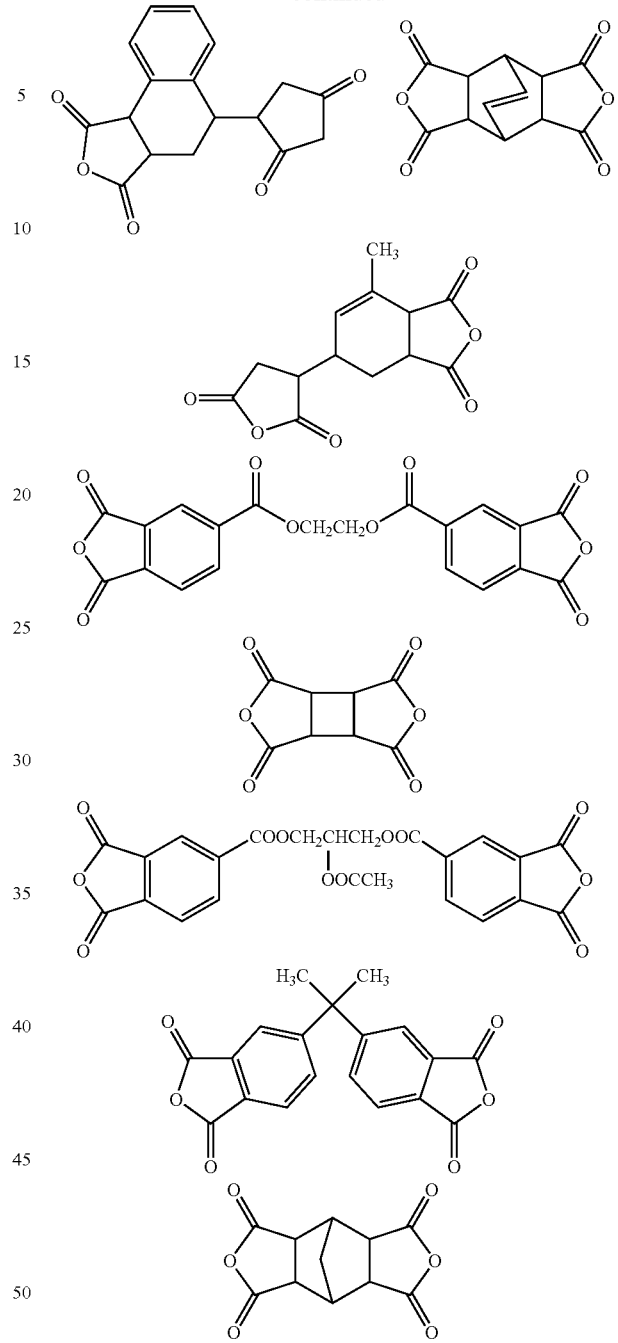

The present invention further provides a photosensitive composition comprising at least about 1% of the photosensitive polyimide of formula (I), a photoinitiator, and a solvent. The photosensitive composition of the invention can be used as a liquid photo resist or dry film resist, or used in a solder resist, coverlay film, or printed wiring board. The weight percentages of the components of the photosensitive composition can be adjusted to fulfill the demands of the desired product. Normally, the photosensitive polyimide of formula (I) is present in an amount of at least about 1% by weight, preferably 5% to 90% by weight, based on the total weight of the photosensitive composition, and the photoinitiator is present in an amount of at least about 0.001 by weight, preferably about 0.01% to 10% by weight, based on the total weight of the photosensitive composition.

According to the present invention, the photoinitiators suitable for the above-mentioned composition are not particularly limited and can be selected from the group consisting of: benzophenone, benzoin, 2-hydroxy-2-methyl-1-phenyl-propan-1-one, 2,2-dimethoxy-1,2-diphenylethan-1-one, 1-hydroxy cyclohexyl phenyl ketone, 2,4,6-trimethylbenzoyl diphenyl phosphine oxide, N-phenylglycine, 9-phenylacridine, benzyldimethylketal, 4,4'-bis(diethylamino)benzophenone, 2,4,5-triarylimidazole dimers and a mixture thereof. Preferably, the photoinitiator is 2,4,6-trimethylbenzoyl diphenyl phosphine oxide.

According to the present invention, the solvent suitable for the above-mentioned composition is not particularly limited and can be selected from the group consisting of N-methylpyrrolidone (NMP), N,N-dimethylacetamide (DMAC), N,N-dimethylformamide (DMF), dimethyl sulfoxide (DMSO), toluene, xylene, and a mixture thereof.

In order to increase the photo-crosslinking degree and improve the film-forming properties, the photosensitive composition of the present invention optionally comprises a reactive monomer or short-chain oligomer for making the molecules crosslinked. According to the present invention, suitable reactive monomers or oligomers are not particularly limited and can be selected from the group consisting of: 1,6-hexanediol diacrylate, neopentyl glycol diacrylate, ethylene glycol diacrylate, pentaerythritol diacrylate, trimethylolpropane triacrylate, pentaerythritol triacrylate, dipentaerythritol hexaacrylate, tetramethylolpropane tetraacrylate, tetraethylene glycol diacrylate, 1,6-hexanediol dimethacrylate, neopentyl glycol dimethacrylate, ethylene glycol dimethacrylate, pentaerythritol dimethacrylate, trimethylolpropane trimethacrylate, pentaerythritol trimethacrylate, dipentaerythritol hexamethacrylate, tetramethylolpropane tetramethacrylate, tetraethylene glycol dimethacrylate, methoxydiethylene glycol methacrylate, methoxypolyethylene glycol methacrylate, β-methacryloyloxyethylhydrodiene phthalate, β-methacryloyloxyethylhydrodiene succinate, 3-chloro-2-hydroxypropyl methacrylate, stearyl methacrylate, phenoxyethyl acrylate, phenoxydiethylene glycol acrylate, phenoxypolyethylene glycol acrylate, β-acryloyloxyethylhydrodiene succinate, lauryl acrylate, ethylene glycol dimethacrylate, diethylene glycol dimethacrylate, triethylene glycol dimethacrylate, polyethylene glycol dimethacrylate, 1,3-butylene glycol dimethacrylate, polypropylene glycol dimethacrylate, 2-hydroxy-1,3-dimethacryloxypropane, 2,2-bis[4-(methacryloxyethoxy)phenyl]propane, 2,2-bis[4-(methacryloxydiethoxy)phenyl]propane, 2,2-bis[4-(methacryloxypolyethoxy)phenyl]propane, polyethylene glycol diacrylate, tripropylene glycol diacrylate, polypropylene glycol diacrylate, 2,2-bis[4-(acryloxydiethoxy)phenyl]propane, 2,2-bis[4-(acryloxypolyethoxy)phenyl]propane, 2-hydroxy-1-acryloxy-3-methacryloxypropane, trimethylolpropane trimethacrylate, tetramethylolmethane triacrylate, tetramethylolmethane tetraacrylate, methoxydipropylene glycol methacrylate, methoxytriethylene glycol acrylate, nonylphenoxypolyethylene glycol acrylate, nonylphenoxypolypropylene glycol acrylate, 1-acryloyloxypropyl-2-phthalate, isostearyl acrylate, polyoxyethylene alkyl ether acrylate, nonylphenoxyethylene glycol acrylate, polypropylene glycol dimethacrylate, 1,4-butanediol dimethacrylate, 3-methyl-1,5-pentanediol dimethacrylate, 1,6-hexanediol methacrylate, 1,9-nonanediol methacrylate, 2,4-diethyl-1,5-pentanediol dimethacrylate, 1,4-cyclohexanedimethanol dimethacrylate, dipropylene glycol diacrylate, tricyclodecanedimethanol diacrylate, 2,2-hydrogenated bis[4-acryloxypolyethoxy]phenyl)propane, 2,2-bis[4-acryloxypolypropoxy]phenyl)propane, 2,4-diethyl-1,5-pentanediol diacrylate, ethoxylated trimethylolpropane triacrylate, propoxylated trimethylolpropane triacrylate, isocyanuric acid tri(ethaneacrylate), pentaerythritol tetraacrylate, ethoxylated pentaerythritol tetraacrylate, propoxylated pentaerythritol tetraacrylate, ditrimethylolpropane tetraacrylate, dipentaerythritol polyacrylate, triallyl isocyanurate, glycidyl methacrylate, allyl glycidyl ether, 1,3,5-triacryloylhexahydro-s-triazine, triallyl 1,3,5-benzenecarboxylate, triallylamine, triallyl citrate, triallyl phosphate, allobarbital, diallylamine, diallyldimethylsilane, diallyl disulfide, diallyl ether, diallyl cyanurate, diallyl isophthalate, diallyl terephthalate, 1,3-diallyloxy-2-propanol, diallyl sulfide, diallyl maleate, 4,4'-isopropylidenediphenol dimethacrylate, and 4,4'-isopropylidenediphenol diacrylat. The reactive monomer or oligomer, if present, is present in an amount of at least about 0.1 wt %, preferably from 0.1 wt % to 30 wt % based on the total weight of the photosensitive composition of the present invention.

The invention will be further described by the following examples, and the description is only used to illustrate the present invention, rather than to limit the scope of the present invention. Any modifications or equivalents that can be easily accomplished by persons skilled in the art are within the scope of the disclosure of the present specification and the appended claims.

In the examples, the abbreviations used are defined as follows:

DA1:

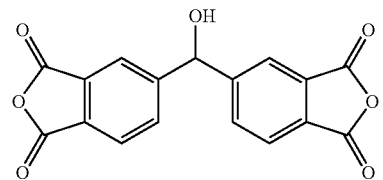

DA2:

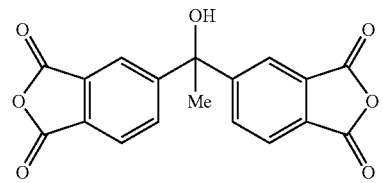

DA3:

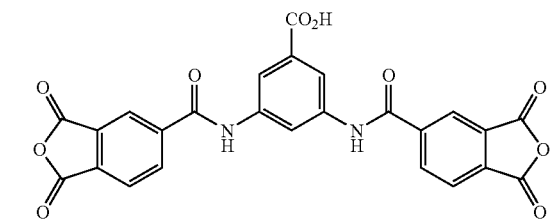

DA4:

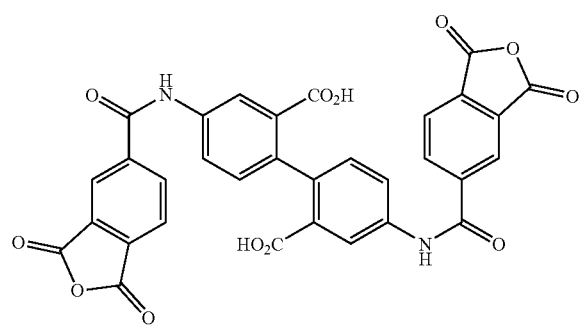

DA5:

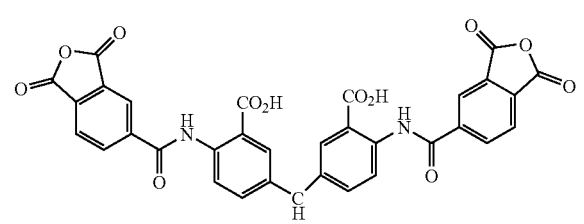

DA6:

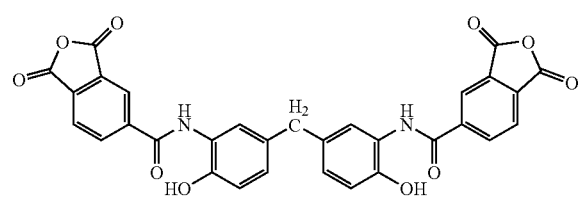

6FDA: 4,4'-hexafluoroisopropylidene-2,2-bis-(phthalic acid anhydride
DMDB: 2,2'-dimethylbiphenyl-4,4'-diamine
ODA: 4,4'-oxydianiline
GMA: glycidyl methacrylate
TBAB: tert-butylammonium bromide
MEHQ: methylhydroquinone
DMAc: dimethyl acetamide
NMP: N-methylpyrrolidone

Example 1

Synthesis of GMA-Modified Polyimide (P1)

64.85 g (0.2 mol) DA1 and 42.46 g (0.2 mol) DMDB were added to 300 mL NMP. The mixture was stirred at room temperature for 1 hour and then warmed up to 50° C. and stirred for 4 hours. Thereafter, 50 mL xylene was added and water was removed by dean-stark apparatus at 130° C. After the water was completely removed, the solution was cooled down to room temperature and 6.11 g (0.05 mol) GMA, 0.015 g TBAB, and 0.06 g MEHQ were added. After the addition was completed, the solution was warmed up to 90° C. and stirred for 12 hours to obtain P1.

Example 2

Synthesis of GMA-Modified Polyimide (P2)

73.256 g (0.2 mol) DA2 and 42.46 g (0.2 mol) DMDB were added to 350 mL NMP. The mixture was stirred at room temperature for 1 hour and then warmed up to 50° C. and stirred for 4 hours. Thereafter, 50 mL xylene was added and water was removed by dean-stark apparatus at 130° C. After the water was completely removed, the solution was cooled down to room temperature and 6.11 g (0.05 mol) GMA, 0.015 g TBAB, and 0.06 g MEHQ were added. After the addition was completed, the solution was warmed up to 90° C. and stirred for 12 hours to obtain P2.

Example 3

Synthesis of GMA-Modified Polyimide (P3)

100.074 g (0.2 mol) DA3 and 42.46 g (0.2 mol) DMDB were added to 450 mL NMP. The mixture was stirred at room temperature for 1 hour and then warmed up to 50° C. and stirred for 4 hours. Thereafter, 50 mL xylene was added and water was removed by dean-stark apparatus at 130° C. After the water was completely removed, the solution was cooled down to room temperature and 6.11 g (0.05 mol) GMA, 0.015 g TBAB, and 0.06 g MEHQ were added. After the addition was completed, the solution was warmed up to 90° C. and stirred for 12 hours to obtain P3.

Example 4

Synthesis of GMA-Modified Polyimide (P4)

124.1 g (0.2 mol) DA4 and 42.46 g (0.2 mol) DMDB were added to 550 mL NMP. The mixture was stirred at room temperature for 1 hour and then warmed up to 50° C. and stirred for 4 hours. Thereafter, 50 mL xylene was added and water was removed by dean-stark apparatus at 130° C. After the water was completely removed, the solution was cooled down to room temperature and 12.22 g (0.1 mol) GMA, 0.03 g TBAB, and 0.06 g MEHQ were added. After the addition was completed, the solution was warmed up to 90° C. and stirred for 12 hours to obtain P4.

Example 5

Synthesis of GMA-Modified Polyimide (P5)

126.9 g (0.2 mol) DA5 and 42.46 g (0.2 mol) DMDB were added to 550 mL NMP. The mixture was stirred at room temperature for 1 hour and then warmed up to 50° C. and stirred for 4 hours. Thereafter, 50 mL xylene was added and water was removed by dean-stark apparatus at 130° C. After the water was completely removed, the solution was cooled down to room temperature and 12.22 g (0.1 mol) GMA, 0.03 g TBAB, and 0.06 g MEHQ were added. After the addition was completed, the solution was warmed up to 90° C. and stirred for 12 hours to obtain P5.

Example 6

Synthesis of GMA-Modified Polyimide (P6)

115.7 g (0.2 mol) DA6 and 42.46 g (0.2 mol) DMDB were added to 500 mL NMP. The mixture was stirred at room temperature for 1 hour and then warmed up to 50° C. and stirred for 4 hours. Thereafter, 50 mL xylene was added and water was removed by dean-stark apparatus at 130° C. After the water was completely removed, the solution was cooled down to room temperature and 6.11 g (0.05 mol) GMA, 0.015 g TBAB, and 0.06 g MEHQ were added. After the addition was completed, the solution was warmed up to 90° C. and stirred for 12 hours to obtain P6.

Example 7

Synthesis of GMA-Modified Polyimide (P7)

64.85 g (0.2 mol) DA1 and 40.05 g (0.2 mol) ODA were added to 300 mL DMAc. The mixture was stirred at room temperature for 1 hour and then warmed up to 50° C. and stirred for 4 hours. Thereafter, 50 mL xylene was added and water was removed by dean-stark apparatus at 130° C. After the water was completely removed, the solution was cooled down to room temperature and 6.11 g (0.05 mol) GMA, 0.015 g TBAB, and 0.06 g MEHQ were added. After the addition was completed, the solution was warmed up to 90° C. and stirred for 12 hours to obtain P7.

Example 8

Synthesis of GMA-Modified Polyimide (P8)

73.26 g (0.2 mol) DA2 and 40.05 g (0.2 mol) ODA were added to 350 mL DMAc. The mixture was stirred at room temperature for 1 hour and then warmed up to 50° C. and stirred for 4 hours. Thereafter, 50 mL xylene was added and water was removed by dean-stark apparatus at 130° C. After the water was completely removed, the solution was cooled down to room temperature and 6.11 g (0.05 mol) GMA, 0.015 g TBAB, and 0.06 g MEHQ were added. After the addition was completed, the solution was warmed up to 90° C. and stirred for 12 hours to obtain P8.

Example 9

Synthesis of GMA-Modified Polyimide (P9)

100.074 g (0.2 mol) DA3 and 40.05 g (0.2 mol) ODA were added to 450 mL DMAc. The mixture was stirred at room temperature for 1 hour and then warmed up to 50° C. and stirred for 4 hours. Thereafter, 50 mL xylene was added and water was removed by dean-stark apparatus at 130° C. After the water was completely removed, the solution was cooled down to room temperature and 6.11 g (0.05 mol) GMA, 0.015 g TBAB, and 0.06 g MEHQ were added. After the addition was completed, the solution was warmed up to 90° C. and stirred for 12 hours to obtain P9.

Example 10

Synthesis of GMA-Modified Polyimide (P10)

124.1 g (0.2 mol) DA4 and 40.05 g (0.2 mol) ODA were added to 550 mL DMAc. The mixture was stirred at room temperature for 1 hour and then warmed up to 50° C. and stirred for 4 hours. Thereafter, 50 mL xylene was added and water was removed by dean-stark apparatus at 130° C. After the water was completely removed, the solution was cooled down to room temperature and 12.22 g (0.1 mol) GMA, 0.03 g TBAB, and 0.06 g MEHQ were added. After the addition was completed, the solution was warmed up to 90° C. and stirred for 12 hours to obtain P10.

Example 11

Synthesis of GMA-Modified Polyimide (P11)

126.9 g (0.2 mol) DA5 and 40.05 g (0.2 mol) ODA were added to 550 mL DMAC. The mixture was stirred at room temperature for 1 hour and then warmed up to 50° C. and stirred for 4 hours. Thereafter, 50 mL xylene was added and water was removed by dean-stark apparatus at 130° C. After the water was completely removed, the solution was cooled down to room temperature and 12.22 g (0.1 mol) GMA, 0.03 g TBAB, and 0.06 g MEHQ were added. After the addition was completed, the solution was warmed up to 90° C. and stirred for 12 hours to obtain P11.

Example 12

Synthesis of GMA-Modified Polyimide (P12)

115.7 g (0.2 mol) DA6 and 40.05 g (0.2 mol) ODA were added to 550 mL DMAC. The mixture was stirred at room temperature for 1 hour and then warmed up to 50° C. and stirred for 4 hours. Thereafter, 50 mL xylene was added and water was removed by dean-stark apparatus at 130° C. After the water was completely removed, the solution was cooled down to room temperature and 6.11 g (0.05 mol) GMA, 0.015 g TBAB, and 0.06 g MEHQ were added. After the addition was completed, the solution was warmed up to 90° C. and stirred for 12 hours to obtain P12.

Example 13

Synthesis of GMA-Modified Polyimide (P13)

57.85 g (0.1 mol) DA4, 44.42 g (0.1 mol) 6FDA and 40.05 g (0.2 mol) ODA were added to 500 mL DMAc. The mixture was stirred at room temperature for 1 hour and then warmed up to 50° C. and stirred for 4 hours. Thereafter, 50 mL xylene was added and water was removed by dean-stark apparatus at 130° C. After the water was completely removed, the solution was cooled down to room temperature and 6.11 g (0.05 mol) GMA, 0.015 g TBAB, and 0.06 g MEHQ were added. After the addition was completed, the solution was warmed up to 90° C. and stirred for 12 hours to obtain P13.

Example 14

Synthesis of GMA-Modified Polyimide (P14)

63.45 g (0.1 mol) DA5, 44.42 g (0.1 mol) 6FDA and 40.05 g (0.2 mol) ODA were added to 500 mL DMAc. The mixture was stirred at room temperature for 1 hour and then warmed up to 50° C. and stirred for 4 hours. Thereafter, 50 mL xylene was added and water was removed by dean-stark apparatus at 130° C. After the water was completely removed, the solution was cooled down to room temperature and 6.11 g (0.05 mol) GMA, 0.015 g TBAB, and 0.06 g MEHQ were added. After the addition was completed, the solution was warmed up to 90° C. and stirred for 12 hours to obtain P14.

What is claimed is:

1. A photosensitive polyimide of formula (I):

formula (I)

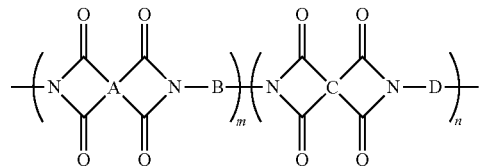

wherein:
A represents a tetravalent organic group with at least one modifying group $R_1$;
B and D are the same or different and each represent a divalent organic group;
C represents a tetravalent organic group without any modifying group $R_1$;
m represents an integer of more than 0; and
n represents 0 or an integer more than 0,
wherein the modifying group $R_1$ is selected from the group consisting of:

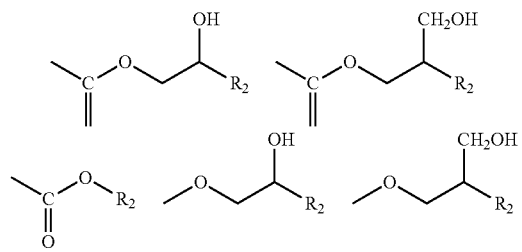

wherein $R_2$ represents a vinyl-group containing unsaturated radical.

2. The photosensitive polyimide of claim 1, wherein the vinyl-group containing unsaturated radical is selected from the group consisting of:

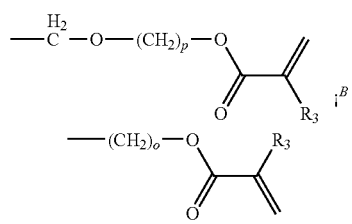

wherein:
$R_3$ represents H or methyl, and o and p each represent an integer of 0 to 6.

3. The photosensitive polyimide of claim 1, wherein A is selected from the group consisting of:

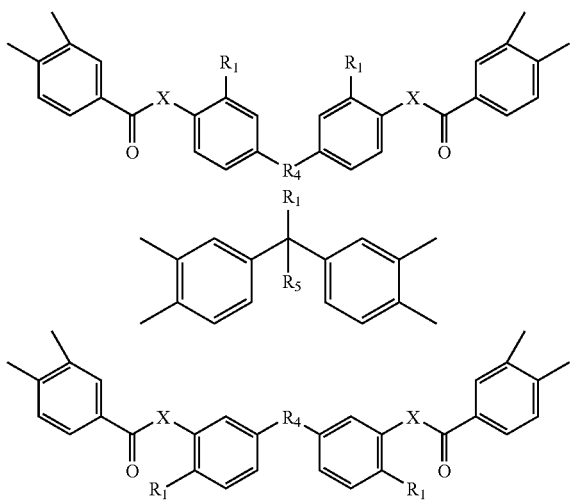

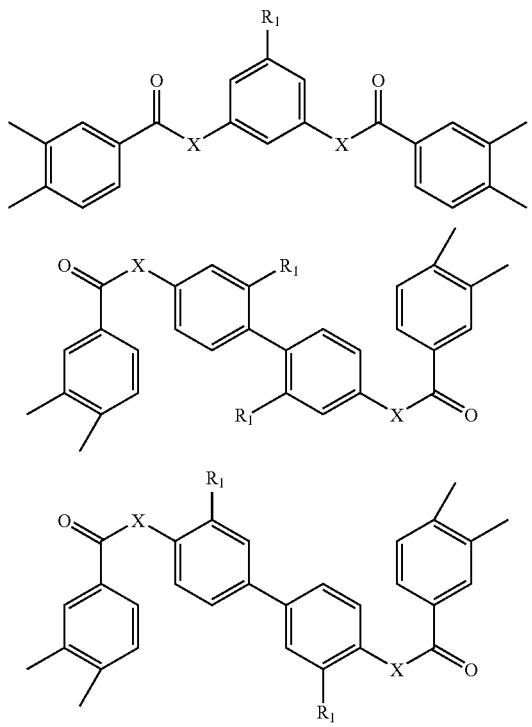

wherein:
$R_1$ is as defined in claim 1;
$R_4$ is $-CH_2-$, $-O-$, $-S-$, $-CO-$, $-SO_2-$, $C(CH_3)_2$, or $C(CF_3)-$;
$R_5$ is $-H$ or $-CH_3$; and
X is $-O-$, $-NH-$, or $-S-$.

4. The photosensitive polyimide of claim 3, wherein A is selected from the group consisting of:

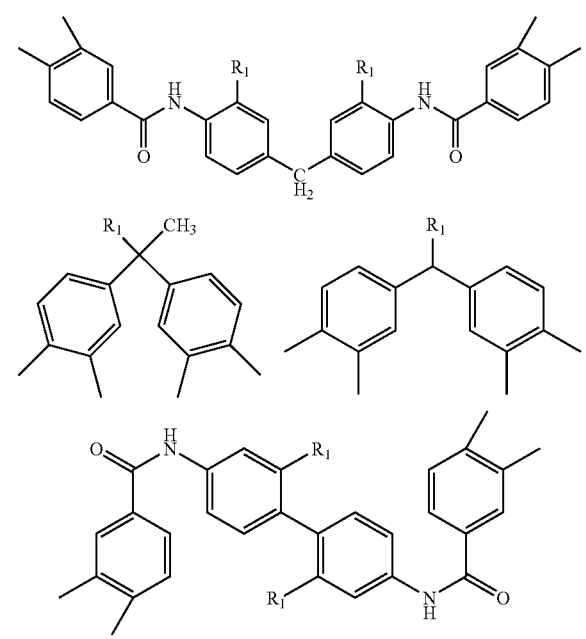

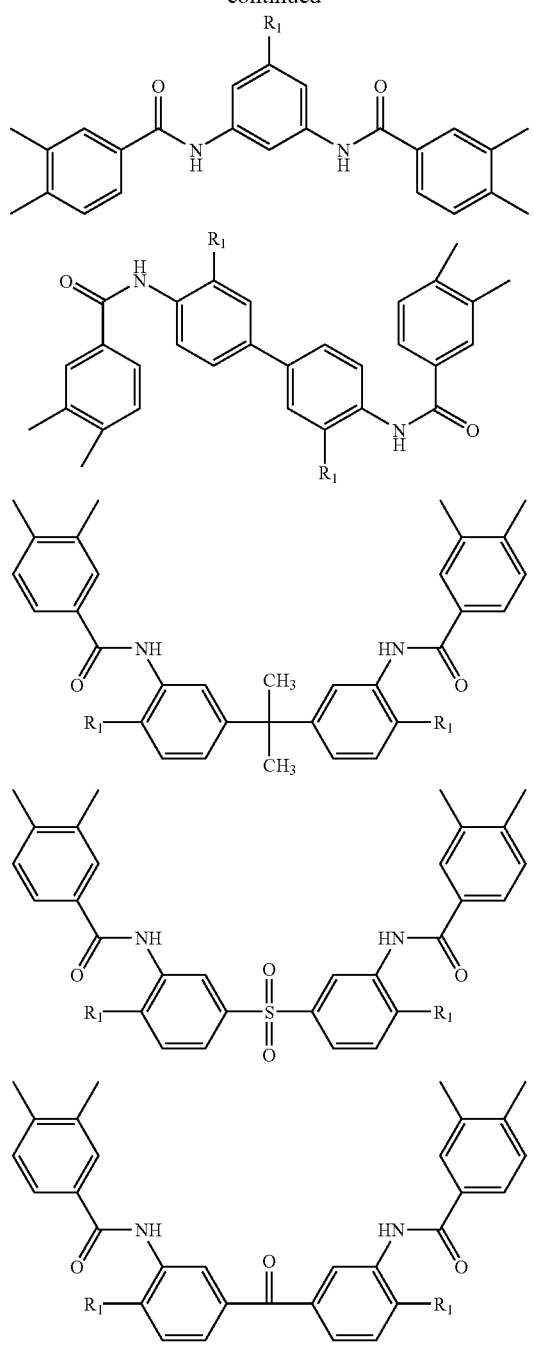
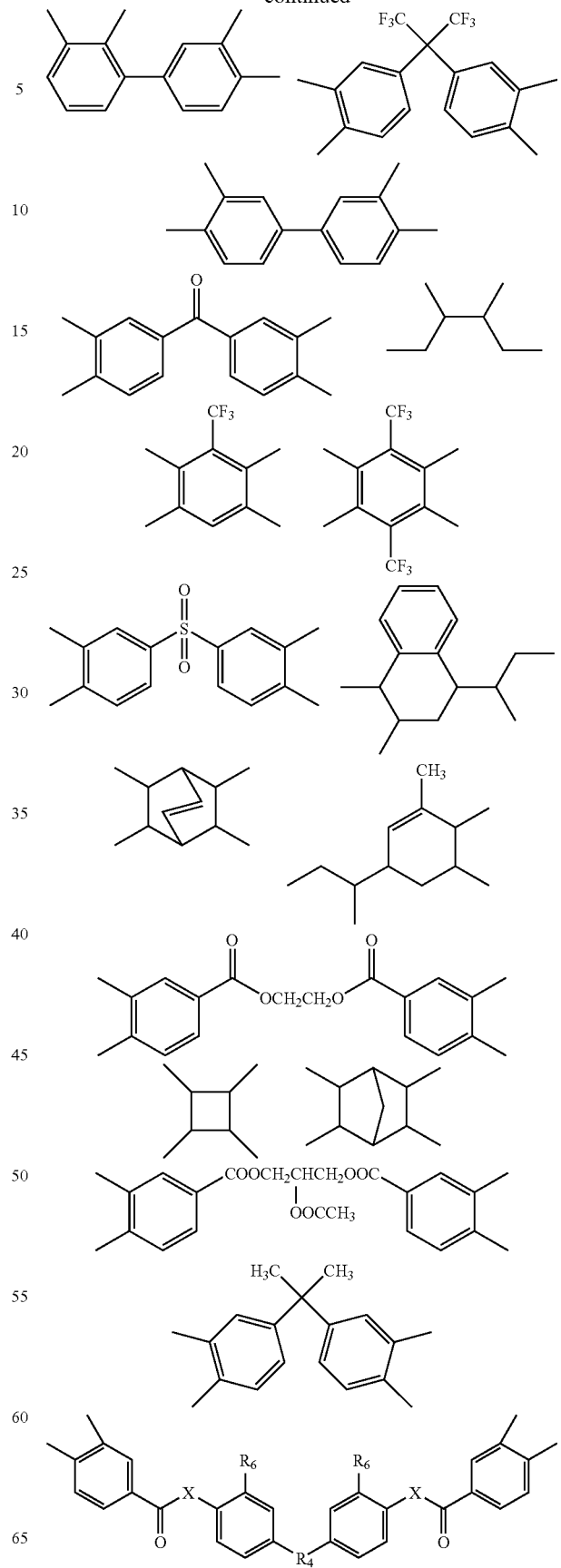
wherein $R_1$ is as defined in claim 1.
5. The photosensitive polyimide of claim 1, wherein C is selected from the group consisting of:
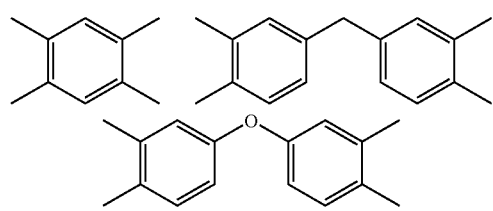

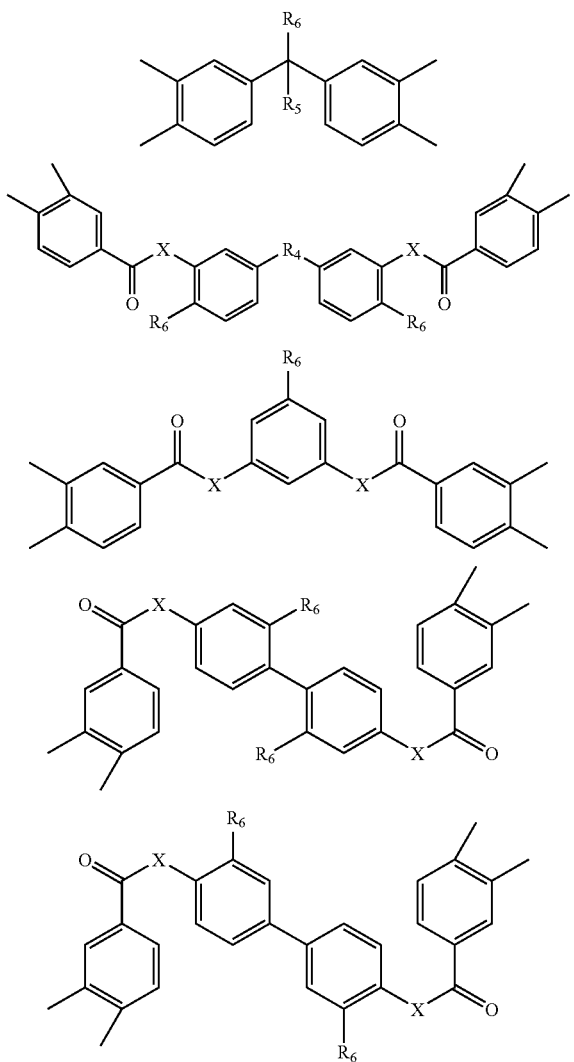
6. The photosensitive polyimide of claim 5, wherein C is selected from the group consisting of:
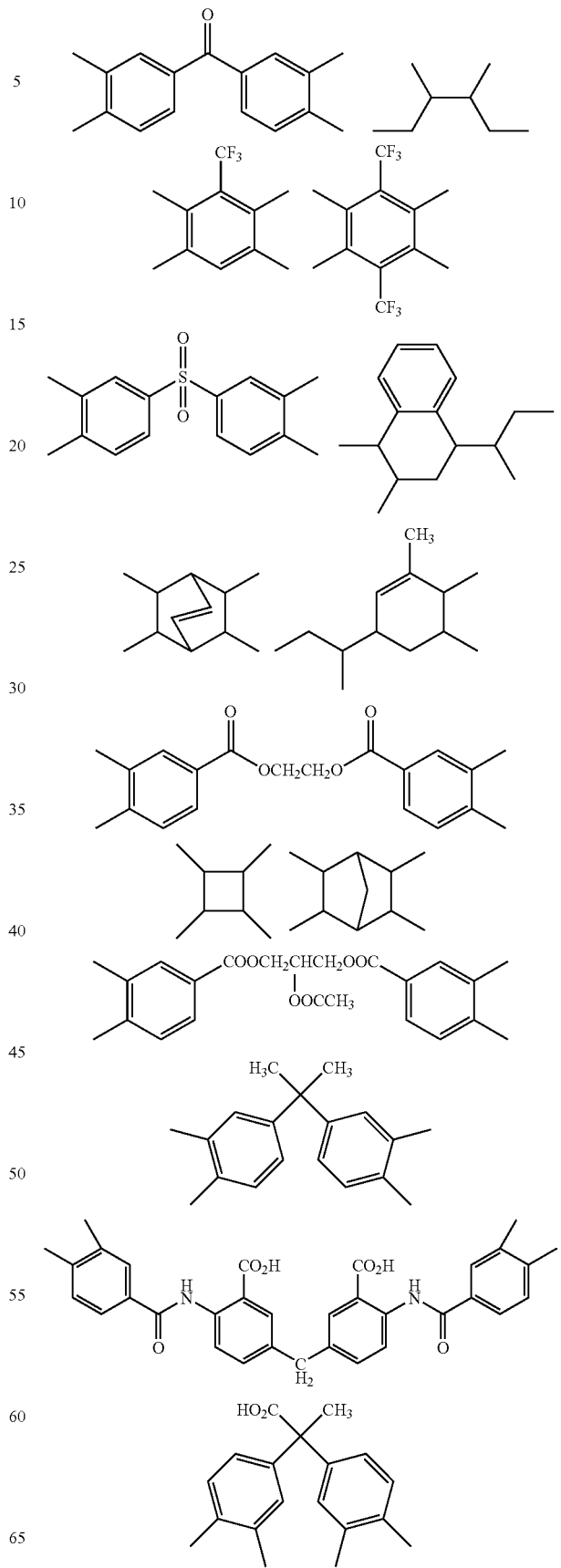

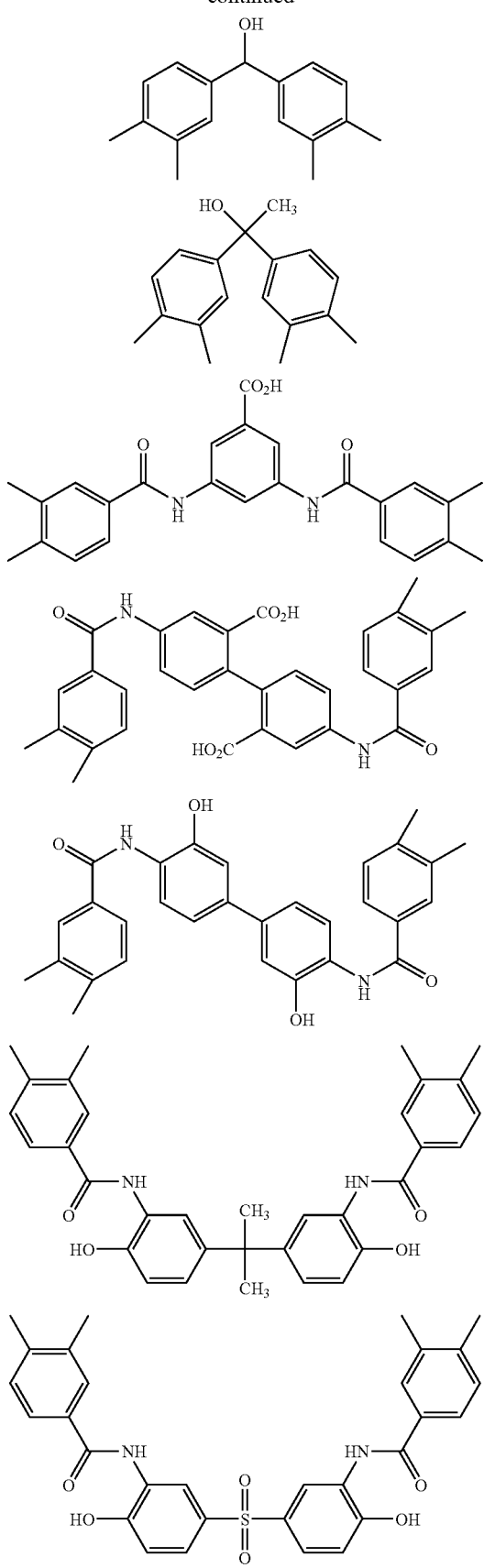

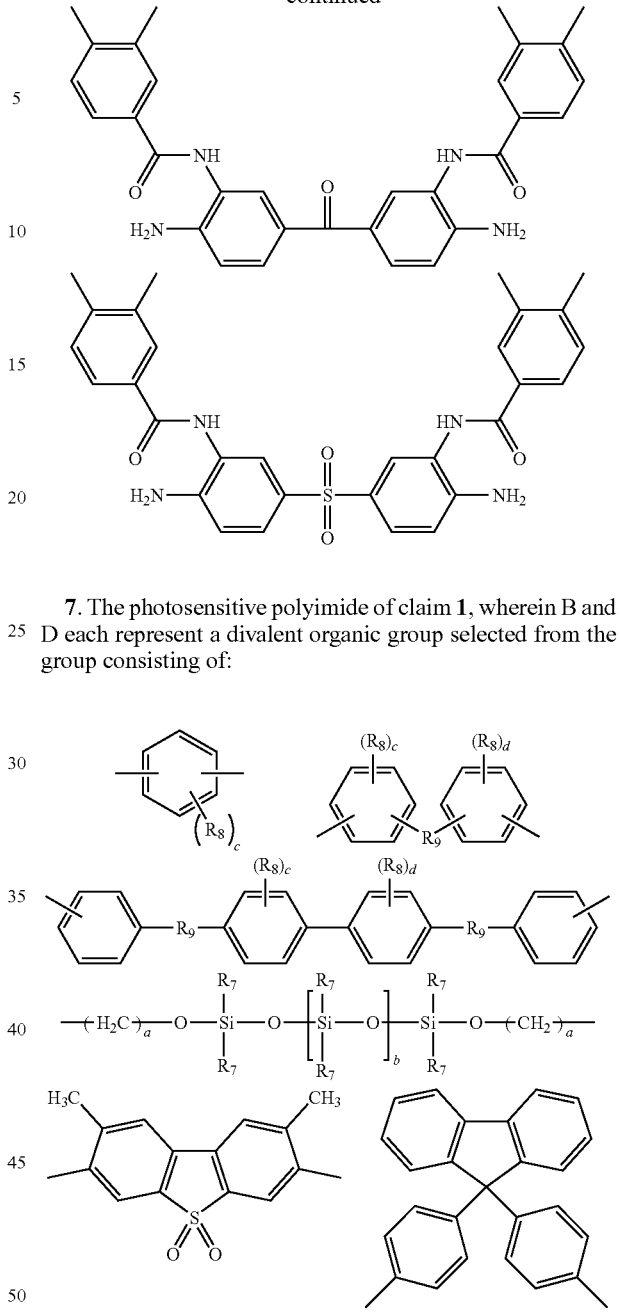

7. The photosensitive polyimide of claim 1, wherein B and D each represent a divalent organic group selected from the group consisting of:

wherein:

$R_7$ is H, methyl, or ethyl;

$R_8$ is H, $C_1$-$C_4$ alkyl, $C_1$-$C_4$ perfluoroalkyl, methoxy, ethoxy, halogen, OH, COOH, $NH_2$ or SH;

a is integer of more than 0;

b is integer of more than 0;

c is an integer of 0 to 4;

d is an integer of 0 to 4; and $R_9$ is a covalent bond or a radical selected from:

—O—, —S—, —$CH_2$—, —$S(O)_2$—,

-continued
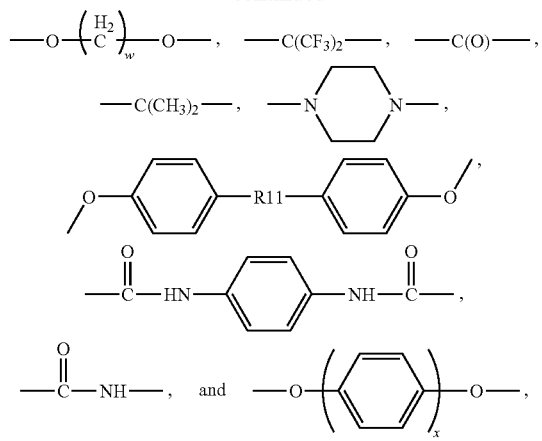
wherein w and x each represent an integer of more than 0, and $R_{11}$ is $-S(O)_2-$, $-C(O)-$, a covalent bond, or a substituted or unsubstituted $C_1$ to $C_{18}$ organic group.
8. The photosensitive polyimide of claim 7, wherein B and D each represent a divalent organic group selected from the group consisting of:
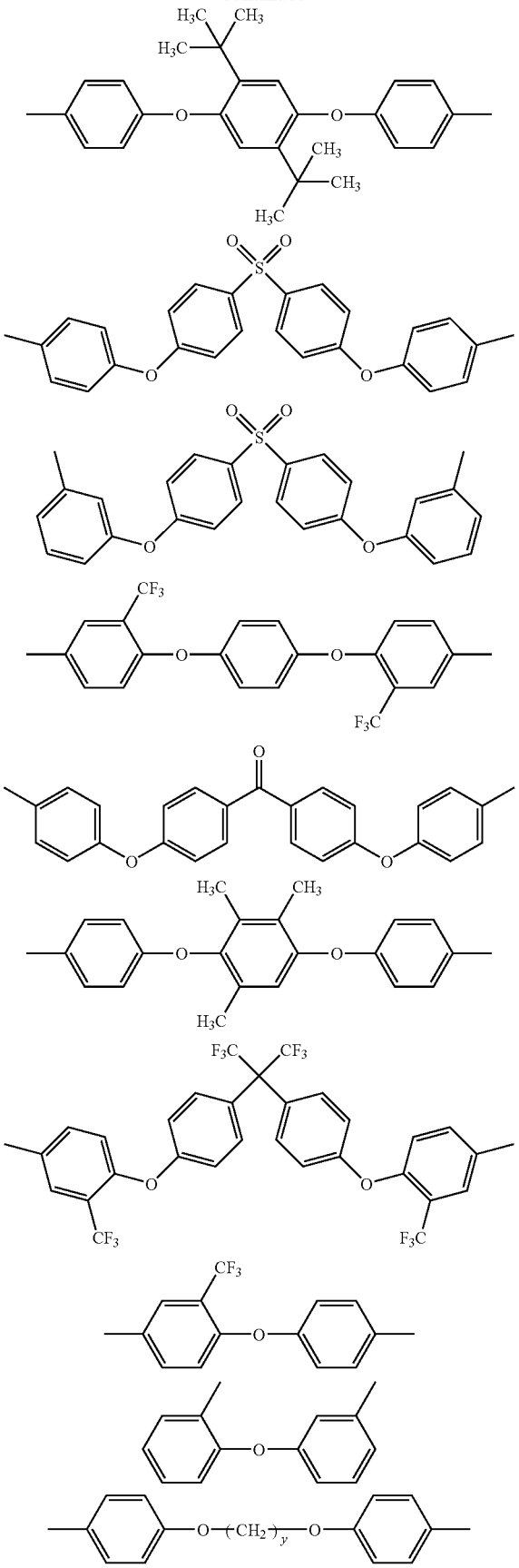

-continued
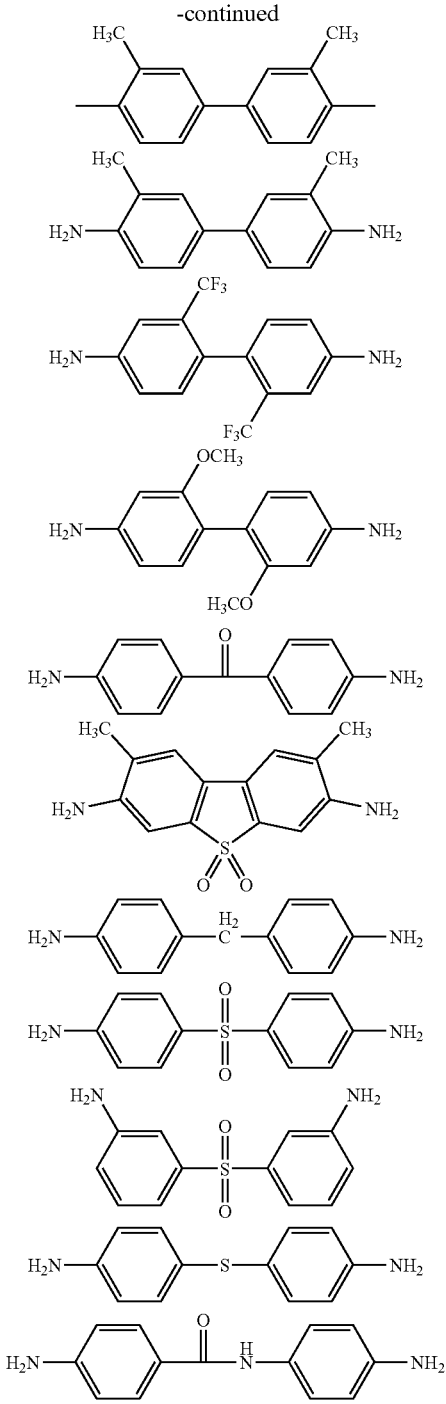
-continued
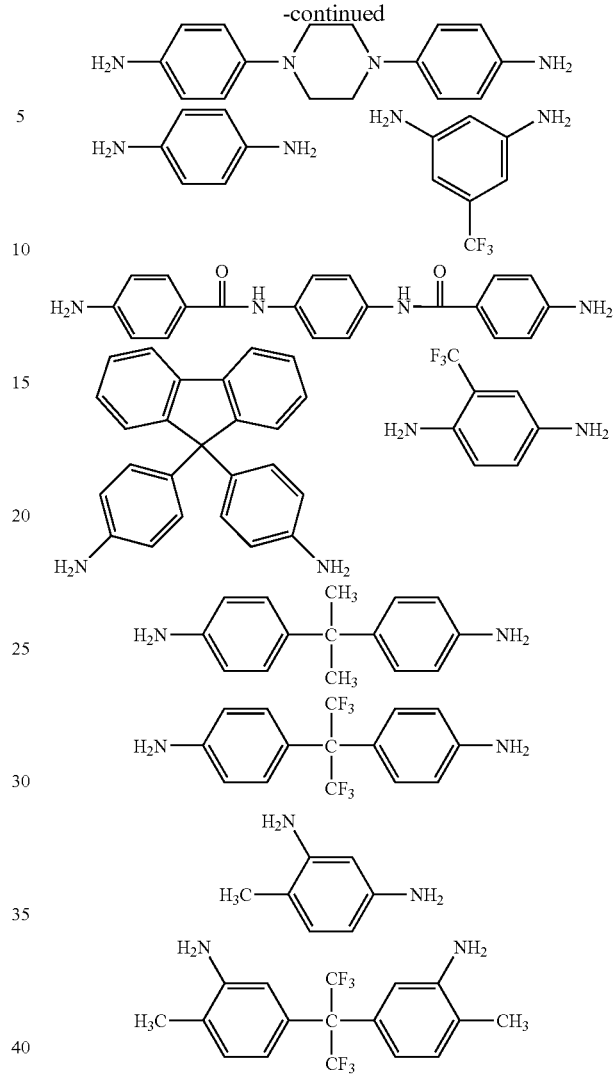
wherein y represents an integer of 1 to 12.
9. A photosensitive composition comprising the photosensitive polyimide as claimed in claim 1 and a photoinitiator.
10. The photosensitive composition of claim 9, further comprising a reactive monomer or oligomer.
11. The photosensitive composition of claim 9 for use in a liquid photo resist or dry film resist.
* * * * *